(12) United States Patent
Chu et al.

(10) Patent No.: US 9,369,139 B1
(45) Date of Patent: Jun. 14, 2016

(54) FRACTIONAL REFERENCE-INJECTION PLL

(71) Applicant: Integrated Device Technology, Inc., San Jose, CA (US)

(72) Inventors: Min Chu, Milpitas, CA (US); Jagdeep Bal, Saratoga, CA (US)

(73) Assignee: INTEGRATED DEVICE TECHNOLOGY, inc., San Jose, CA (US)

( * ) Notice: Subject to any disclaimer, the term of this patent is extended or adjusted under 35 U.S.C. 154(b) by 0 days.

(21) Appl. No.: 14/622,851

(22) Filed: Feb. 14, 2015

(51) Int. Cl.
*H03K 3/03* (2006.01)
*H03L 3/00* (2006.01)
*H03L 7/099* (2006.01)

(52) U.S. Cl.
CPC ............ *H03L 7/0998* (2013.01); *H03K 3/0315* (2013.01); *H03L 3/00* (2013.01); *H03L 7/0995* (2013.01); *H03B 2200/009* (2013.01); *H03B 2200/0094* (2013.01); *H03B 2200/0096* (2013.01); *H03L 2207/06* (2013.01); *H03L 2207/18* (2013.01)

(58) Field of Classification Search
CPC ............ H03B 27/00; H03B 2200/009; H03B 2200/0094; H03B 2200/0096; H03K 3/0315; H03K 3/0322; H03L 3/00; H03L 7/0995; H03L 7/0998; H03L 2207/06
USPC ............................ 331/10, 11, 45, 57, 172–174
See application file for complete search history.

(56) References Cited

U.S. PATENT DOCUMENTS

| 4,862,485 | A | | 8/1989 | Guinea et al. |
| 5,663,105 | A | | 9/1997 | Yu et al. |
| 5,757,240 | A | * | 5/1998 | Boerstler ............ H03K 3/0315 331/177 R |
| 5,903,195 | A | * | 5/1999 | Lukes ................... H03L 7/095 327/156 |
| 6,259,327 | B1 | * | 7/2001 | Balistreri ................ H03L 7/10 331/11 |
| 6,640,311 | B1 | * | 10/2003 | Knowles .................. G06F 1/08 327/7 |
| 6,650,193 | B2 | | 11/2003 | Endo et al. |
| 6,683,506 | B2 | | 1/2004 | Ye et al. |
| 6,727,767 | B2 | | 4/2004 | Takada et al. |

(Continued)

OTHER PUBLICATIONS

Sheng Ye, "Techniques for Phase Noise Suppression in Recirculating DLLs", IEEE Journal of Solid-State Circuits, vol. 39, No. 8, Aug. 2004.

(Continued)

*Primary Examiner* — Levi Gannon
(74) *Attorney, Agent, or Firm* — Glass & Associates; Mark Peloquin; Kenneth Glass

(57) ABSTRACT

Methods and apparatuses are described to reduce phase noise in a low noise fractional reference-injection phase locked loop (FRIPLL). The FRIPLL includes a ring voltage controlled oscillator (VCO). An output of the ring VCO is input to a fractional interpolative frequency divider (FIFD). A signal comparison circuit receives a reference clock signal and a further delayed output of the FIFD. The signal comparison circuit produces a control voltage signal in response to a phase difference between the reference clock signal and the further delayed output of the FIFD. The control voltage signal is input to the ring VCO to control a ring VCO frequency. An oscillator control circuit has a first input and a second input. The first input is a first delayed output of the FIFD. The second input is the reference clock signal. The oscillator control circuit generates a realignment signal which is used to realign a state transition in a ring VCO output signal to the reference clock signal when the ring VCO output signal is in a low state. Realignment occurs repeatedly at a frequency of the reference clock signal.

26 Claims, 10 Drawing Sheets

(56) References Cited

U.S. PATENT DOCUMENTS

| | | | |
|---|---|---|---|
| 6,768,387 B1* | 7/2004 | Masuda | H03K 3/011 331/11 |
| 7,012,476 B2 | 3/2006 | Ogiso et al. | |
| 7,323,916 B1 | 1/2008 | Sidiropoulos et al. | |
| 7,405,594 B1 | 7/2008 | Xu et al. | |
| 7,434,083 B1 | 10/2008 | Wilson et al. | |
| 7,541,848 B1* | 6/2009 | Masuda | H03K 19/018528 327/147 |
| 7,545,188 B1 | 6/2009 | Xu et al. | |
| 7,573,303 B1 | 8/2009 | Chi et al. | |
| 7,586,347 B1 | 9/2009 | Ren et al. | |
| 7,671,635 B2 | 3/2010 | Fan et al. | |
| 7,737,739 B1 | 6/2010 | Bi et al. | |
| 7,750,618 B1 | 7/2010 | Fang et al. | |
| 7,786,763 B1 | 8/2010 | Bal et al. | |
| 7,816,959 B1 | 10/2010 | Isik et al. | |
| 7,907,625 B1 | 3/2011 | MacAdam et al. | |
| 7,941,723 B1 | 5/2011 | Lien et al. | |
| 8,018,289 B1 | 9/2011 | Hu et al. | |
| 8,164,367 B1 | 4/2012 | Bal et al. | |
| 8,179,952 B2 | 5/2012 | Thurston et al. | |
| 8,259,888 B2 | 9/2012 | Hua et al. | |
| 8,284,816 B1 | 10/2012 | Clementi et al. | |
| 8,305,154 B1 | 11/2012 | Kubena et al. | |
| 8,537,952 B1 | 9/2013 | Arora et al. | |
| 8,693,557 B1 | 4/2014 | Zhang et al. | |
| 8,704,564 B2 | 4/2014 | Hasegawa et al. | |
| 8,723,573 B1 | 5/2014 | Wang et al. | |
| 8,791,763 B2* | 7/2014 | Taghivand | H03B 19/14 327/115 |
| 2002/0079937 A1 | 6/2002 | Xanthopoulos et al. | |
| 2002/0191727 A1 | 12/2002 | Staszewski et al. | |
| 2003/0042985 A1* | 3/2003 | Shibahara | H03L 7/0891 331/17 |
| 2004/0136440 A1 | 7/2004 | Miyata et al. | |
| 2004/0165691 A1 | 8/2004 | Rana et al. | |
| 2006/0197614 A1* | 9/2006 | Roubadia | H03B 5/24 331/57 |
| 2006/0290391 A1 | 12/2006 | Leung et al. | |
| 2007/0149144 A1 | 6/2007 | Beyer et al. | |
| 2007/0247248 A1* | 10/2007 | Kobayashi | H03D 13/004 331/167 |
| 2008/0043893 A1 | 2/2008 | Nagaraj et al. | |
| 2008/0104435 A1 | 5/2008 | Pernia et al. | |
| 2008/0129351 A1 | 6/2008 | Chawla et al. | |
| 2008/0246546 A1 | 10/2008 | Ha et al. | |
| 2009/0140896 A1* | 6/2009 | Adduci | H03L 7/0805 341/131 |
| 2009/0231901 A1 | 9/2009 | Kim et al. | |
| 2009/0256601 A1 | 10/2009 | Zhang et al. | |
| 2009/0262567 A1 | 10/2009 | Shin et al. | |
| 2010/0052798 A1* | 3/2010 | Hirai | H03L 7/0995 331/34 |
| 2010/0090731 A1 | 4/2010 | Casagrande et al. | |
| 2010/0194483 A1* | 8/2010 | Storaska | H03L 7/10 331/17 |
| 2010/0323643 A1 | 12/2010 | Ridgers et al. | |
| 2011/0006936 A1 | 1/2011 | Lin et al. | |
| 2011/0285575 A1 | 11/2011 | Landez et al. | |
| 2012/0161829 A1 | 6/2012 | Fernald et al. | |
| 2012/0317365 A1 | 12/2012 | Elhamias et al. | |
| 2012/0328052 A1 | 12/2012 | Etemadi et al. | |
| 2013/0211758 A1 | 8/2013 | Prathapan et al. | |
| 2014/0029646 A1 | 1/2014 | Foxcroft et al. | |
| 2014/0210532 A1 | 7/2014 | Jenkins et al. | |
| 2014/0327478 A1 | 11/2014 | Horng et al. | |
| 2014/0347941 A1 | 11/2014 | Jose et al. | |
| 2015/0162921 A1 | 6/2015 | Chen et al. | |
| 2015/0180594 A1 | 6/2015 | Chakraborty et al. | |
| 2015/0200649 A1 | 7/2015 | Trager et al. | |

OTHER PUBLICATIONS

'19-Output PCIE GEN 3 Buffer, Si53019-A01A, Silicon Laboratories Inc., Rev. 1.1 May 2015, 34 Pages.

'NB3W1200L: 3.3 V 100/133 MHz Differential 1:12 Push-Pull Clock ZDB/Fanout Buffer for PCIe, On Semiconductor, http://onsemi.com, Aug., 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase-Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

Nagaraju, "A Low Noise 1.5GHz VCO with a 3.75% Tuning Range Using Coupled FBAR's", IEEE International Ultrasonics Symposium (IUS), Oct. 2012, pp. 1-4.

Watanabe, "An All-Digital PLL for Frequency Multilication by 4 to 1022 with Seven-Cycle Lock Time", IEEE Journal Df Solid-State Circuits, vol. 39 No. 2, Feb. 2003, pp. 198-204.

* cited by examiner

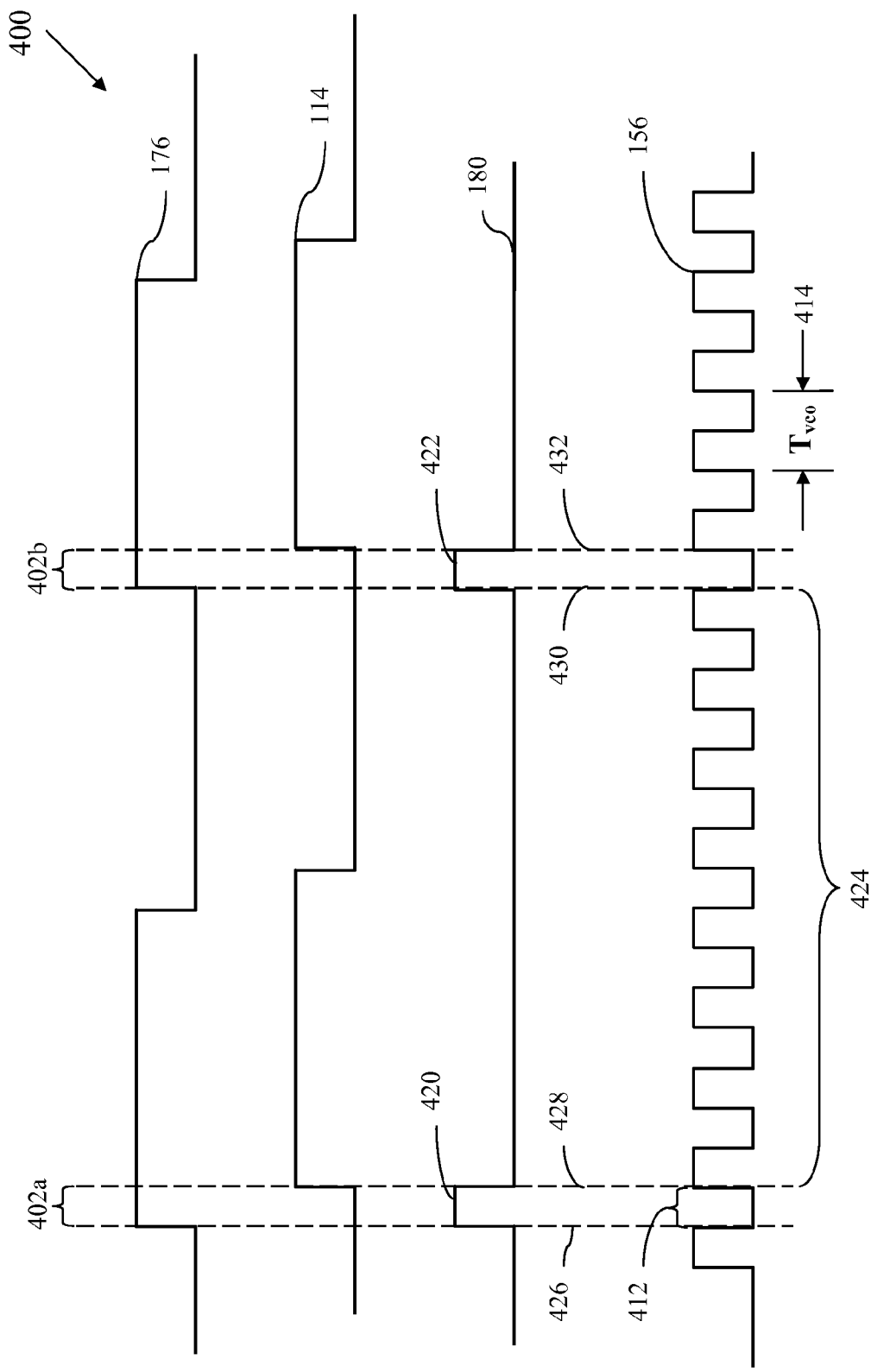

| OFFSET FREQUENCY (Hz) | CONVENTIONAL RING VCO PHASE NOISE (dBc/Hz) | PHASE-REALIGNED VCO PHASE NOISE (dBc/Hz) | REDUCTION IN PHASE NOISE (dBc/Hz) |
|---|---|---|---|
| 100 | 27.59 | -126.12 | 153.71 |
| 1k | -2.01 | -126.33 | 124.32 |
| 10k | -31.62 | -126.34 | 94.72 |
| 100k | -60.74 | -126.34 | 65.60 |
| 1M | -90.04 | -126.34 | 36.30 |

FIG 8

FRACTIONAL REFERENCE-INJECTION PLL

BACKGROUND OF THE INVENTION

1. Field of Invention

The invention relates generally to noise reduction in phase locked loops (PLL) which employ ring type voltage controlled oscillators (VCO), and more specifically to apparatuses and methods for phase noise reduction in phase locked loops employing true fractional divide capability.

2. Art Background

Phase locked loops are used in a wide range of applications such as clock generation, clock alignment, deskewing, jitter reduction, clock distribution, frequency synthesis, etc. Phase noise arises when state transitions of a clock signal depart from the ideal instances causing narrower timing margins and degradation of system performance. This can present a problem.

Electronic devices such as computers, mobile phones, tablets, network equipment, communication channels, etc. often have a variety of oscillators operating at different frequencies. "Clean" oscillators are those based on vibration of a crystal. Crystal oscillators exhibit very stable vibration characteristics which result in low phase noise. Crystal oscillators of arbitrary frequency are impractical because quartz crystals have limited frequency range (kHz to MHz range) and high frequency crystals are expensive. An example of a crystal-less oscillator is a ring voltage controlled oscillator (VCO) constructed with an odd number of inverters or related devices. Ring VCOs are susceptible to the accumulation of phase noise due to thermal and flicker noise in the inverters or in the other electronic devices that are used in the ring, such as NOR gates, etc. The accumulation of phase noise over many cycles in a ring VCO leads to phase noise which can become unacceptably high for a given application, thereby rendering the low cost ring VCO unsuited for the given application. This can present a problem.

SUMMARY

Methods and apparatuses are described to reduce phase noise in a low noise fractional reference-injection phase locked loop (FRIPLL). The FRIPLL includes a ring voltage controlled oscillator (VCO). An output of the ring VCO is input to a fractional interpolative frequency divider (FIFD). A signal comparison circuit receives a reference clock signal and a further delayed output of the FIFD. The signal comparison circuit produces a control voltage signal in response to a phase difference between the reference clock signal and the further delayed output of the FIFD. The control voltage signal is input to the ring VCO to control a ring VCO frequency. An oscillator control circuit has a first input and a second input. The first input is a first delayed output of the FIFD. The second input is the reference clock signal. The oscillator control circuit generates a realignment signal which is used to realign a state transition in a ring VCO output signal to the reference clock signal when the ring VCO output signal is in a low state. Realignment occurs repeatedly at a frequency of the reference clock signal, oscillator phase noise is reduced because of the realignment of the state transition.

Delays are chosen for the first delayed output of the FIFD and the further delayed output of the FIFD to create a width for the realignment signal peak that is less than or equal to one-half of a ring VCO cycle. In one or more embodiments, the first delayed output of the FIFD is delayed approximately one-half of the ring VCO cycle and the further delayed output of the FIFD is delayed another one-half of the ring VCO cycle relative to the first delayed output of the FIFD.

In one or more embodiments, a D flip flop is used in the oscillator control circuit, the reference clock signal is coupled to a reset port of the D flip flop, the first delayed output of the FIFD is coupled to a clock port of the D flip flop, and an output port of the D flip flop is coupled to an input of a device in the ring VCO, the device is configured as a NOR gate. In one or more embodiments the device is a last device in the ring VCO and the last device is configured as a NOR gate. In one or more embodiments, a NOR gate is used for a last device in the ring VCO.

In one or more embodiments, a fractional reference-injection phase locked loop (FRIPLL) includes an integer divider. An input of the integer divider is coupled to an output of the ring VCO. An output of the integer divider is coupled to a clock input of the first latch. An inversion of the output of the ring VCO is coupled to a clock input of the second latch. An output of the first latch is coupled to an input of the second latch. The output of the ring VCO is coupled to a clock input of the third latch. An output of the second latch is coupled to an input of the third latch. The inversion of the output of the ring VCO is coupled to a clock input of a fourth latch. An output of the third latch is coupled to an input of the fourth latch. An output of the fourth latch is coupled to an input of the first latch. A phase interpolator receives the outputs from the first, second, and third latches as inputs. The phase interpolator receives an input from an accumulator. A fraction is input to the accumulator and the phase interpolator produces a vector sum based on its inputs in order to complete the division of a VCO frequency by a desired floating point number. An output of the phase interpolator is input into the first delay unit and the first delay unit receives the inversion of the output of the ring VCO as a clock input. An output of the first delay unit is the first delayed output of the FIFD which is the first input to the oscillator control circuit. A second delay unit receives the output of the first delay unit as an input and the second delay unit receives the output of the ring VCO as a clock input. An output of the second delay unit is the further delayed output of the FIFD which is input to the signal comparison circuit.

In one or more embodiments, the first delay unit is a latch and the second delay unit is a latch. In one or more embodiments, the first delayed output of the FIFD and the further delayed output of the FIFD are extracted from the FIFD without using dedicated latches to provide a delay equal to one-half of the ring VCO cycle for the first delayed output of the FIFD and a delay equal to one-half of the ring VCO cycle for the further delayed output of the FIFD relative to the first delayed output of the FIFD.

In one or more embodiments, a fractional reference-injection phase locked loop (FRIPLL) includes an integer divider. An input of the integer divider is coupled to an output of the ring VCO. An output of the integer divider is coupled to a clock input of a first latch. An inversion of the output of the ring VCO is coupled to the clock input of a second latch. An output of the first latch is coupled to an input of the second latch. The output of the ring VCO is coupled to a clock input of a third latch. An output of the second latch is coupled to an input of the third latch. The inversion of the output of the ring VCO is coupled to a clock input of a fourth latch. An output of the third latch is coupled to an input of the fourth latch. An output of the fourth latch is coupled to an input of the first latch. The first phase interpolator receives the outputs from the second, third, and fourth latches as inputs and the first phase interpolator receives an input from an accumulator. An output of the first phase interpolator is the further delayed output of the FIFD which is input to the signal comparison circuit. The second phase interpolator receives the outputs from the first, second, and third latches as inputs and the second phase interpolator receives an input from the accumulator. A fraction is input to the accumulator and the first phase interpolator and the second phase interpolator produce a vector sum based on their inputs in order to complete division of a reference frequency by a desired floating point number. An output of the second phase interpolator is the first delayed output of the FIFD which is input to the oscillator control circuit.

In one or more embodiments, the signal comparison circuit utilizes a signal comparator. The signal comparator can be a phase detector, or a phase-frequency detector, or a time to digital converter. In one or more embodiments, the ring VCO is a gated ring voltage controlled oscillator.

In one or more embodiments, a method to reduce noise in a FRIPLL, includes generating a realignment signal for a ring VCO using an oscillator correction circuit, a reference clock signal, and a first delayed output from a FIFD. An output of the ring VCO is an input to the FIFD. A state transition in the ring VCO output signal is aligned to the reference clock signal. The realigning occurs when the ring VCO output signal is in a low state. The realignment signal causes the ring VCO to stop and then restart oscillation. The realigning is performed at the reference clock signal frequency and oscillator phase noise is reduced because of the realigning.

In one or more embodiments, a fractional reference-injection phase locked loop (FRIPLL) includes a ring VCO. An output of the ring VCO is an input to a FIFD. A means for generating a realignment signal for the ring VCO uses as inputs a reference clock signal, and a first delayed output from the FIFD. The FRIPLL includes a means for realigning a state transition in the ring VCO output signal to a reference clock signal. The realigning occurs when the ring VCO output signal is in a low state. The realignment signal causes the ring VCO to restart oscillation. The FRIPLL includes a means for performing the realigning at a frequency of the reference clock signal and oscillator phase noise is reduced because of the realigning.

In one or more embodiments the means for generating the realignment signal uses separate mixing operations to form the first delayed output from the FIFD and the further delayed output from the FIFD.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

FIG. 4A illustrates times series representations of signals used to create the alignment signal, according to embodiments of the invention.

FIG. 8 illustrates a table of values that correspond with the plot shown in FIG. 7, according to embodiments of the invention.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

A true fractional phase locked loop is described with a low noise ring voltage controlled oscillator (VCO). Noise reduction is accomplished by realigning the ring VCO output to the reference oscillator signal using various embodiments of the invention. Embodiments of the invention can be used to create a low power small footprint circuit which can be made at a low cost with corresponding low phase noise performance.

Figure 1:
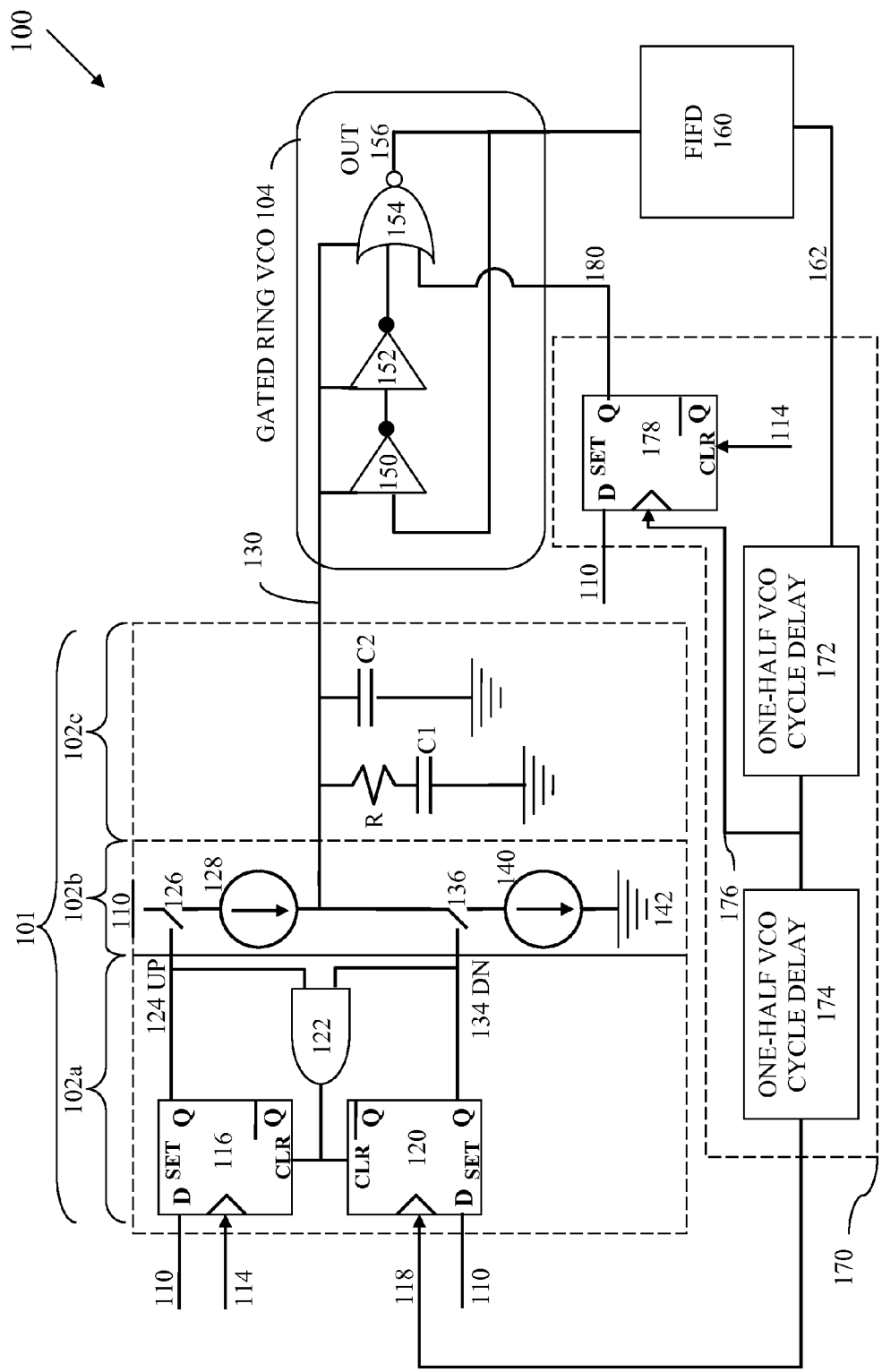
FIG. 1 illustrates circuit architecture for ring oscillator phase noise reduction, according to embodiments of the invention.

FIG. 1 illustrates functional architecture for ring oscillator phase noise reduction, according to embodiments of the invention. With reference to FIG. 1, a fractional reference-injection phase locked loop (FRIPLL) is shown generally at 100. The FRIPLL has a signal comparison circuit 101 which receives as inputs, a reference clock signal 114, a feedback clock signal 118, and a source of electrical power 110. A control voltage signal 130 is output from the signal comparison circuit 101 and is input to a ring voltage controlled oscillator (VCO) 104; control voltage signal 130 is used to adjust the frequency of the ring VCO 104. The ring VCO 104 generates an output 156 which is input into a fractional interpolative frequency divider (FIFD) 160. The FIFD 160 generates an output 162 which is input to an oscillator control circuit 170. The oscillator control circuit 170 generates a realign signal 180 which is input to the ring VCO 104. A feedback clock signal 118 is output from the oscillator control circuit 170 and is input to the signal comparison circuit 101.

The general operation of the FRIPLL is to drive the phase of the feedback clock signal 118 to align with the phase of the reference clock 114. In such a configuration, the reference clock has a stable phase and is typically generated externally from the circuit shown in FIG. 1. However, in some embodiments, a reference oscillator is incorporated with the circuit of 100 in order to generate the reference clock signal 114. Ring type oscillators, such as ring VCO 104 have noise characteristics that are higher than the noise characteristics of the reference oscillator. Therefore, noise on the ring VCO tends to accumulate with clock cycles thereby degrading the long term noise performance of the ring VCO. In general operation, according to embodiments of the invention, the realign signal 180 stops and restarts the ring VCO. When the ring VCO 104 restarts, the realignment signal 180 causes the ring VCO to start in alignment with the reference clock signal 114. In this fashion phase noise is limited to only that which accumulates between realignments of the ring VCO. Several examples are presented within the embodiments of the invention herein which repeat the realignment at the frequency of the reference clock signal. In other embodiments, realignment is done at a frequency different from the frequency of the reference clock.

The circuits shown in this description of embodiments are typically mixed implementations of digital and analog components or sections. In other embodiments, a digital implementation can be realized in the circuit or an analog implementation can be realized. Within this description of embodiments, neither complete circuits nor sections thereof are limited to either digital or analog implementation. Those of skill in the art will readily realize alternatives to some of the components and implementations shown herein, however those alternatives are within the scope of the disclosed embodiments.

In various embodiments, the fractional reference-injection phase locked loop (FRIPLL) 100 is implemented in an integrated circuit device, which may include an integrated circuit package containing the integrated circuit. In some embodiments, the FRIPLL 100 is implemented in a single integrated circuit die. In other embodiments, the FRIPLL 100 is implemented in more than one integrated circuit die of an integrated circuit device which may include a multi-chip package containing the integrated circuit. The embodiments of the present invention are not limited to any particular semiconductor manufacturing technology. Embodiments of the present invention can be implemented using C-MOS, BIPOLAR, Silicon Germanium, or other process technology. The process technologies listed here are provided merely for example and do not limit embodiments of the invention.

Referring to the signal comparison circuit 101, the signal comparison circuit 101 includes a phase detection segment 102a, a charge pump 102b, and a loop filter 102c. The loop filter has components of capacitors C1, C2, and resistor R. In the implementations shown in 102a, a phase frequency detector 102a has a D flip flop (DFF) 116, a DFF 120, and a gate 122. A source of electrical power 110 is provided to DFF 116, the reference clock signal is input to DFF 116 at 114. The feedback clock signal 118, and a source of electrical power 110 are input to DFF 120. An output 124 of DFF 116 operates a switch 126 of the charge pump 102b. An output 134 of DFF 120 operates a switch 136 of charge pump 102b.

In operation, when the phase of the reference clock signal 114 leads the phase of the feedback signal 118, switch 126 closes which allows current to flow from current source 128 onto the loop filter 102c through 130, thereby adjusting a frequency of the ring VCO 104 accordingly within the design parameter of driving the phase of the feedback clock into alignment with the reference clock 114. When the phase of the reference clock signal 114 lags the phase of the feedback signal 118, switch 136 closes which allows current to flow from current source 140 to ground 142, thereby adjusting a frequency of the ring VCO 104 accordingly within the design parameter of driving the phase of the feedback clock into alignment with the reference clock 114.

The ring VCO 104 is configured as a gated ring VCO in 104. Either a ring VCO or a gated ring VCO are used within various embodiments of the invention to reduce oscillator phase noise. As used in the remaining discussion herein for simplicity of nomenclature, use of the term "ring VCO" will be understood to include "gated ring VCO." A ring VCO includes an odd number of devices which are often configured as inverters. The last device in the ring can be configured as a NOR gate as illustrated at 154 with devices 150 and 152 configured as inverters. The ring VCO is described further in FIG. 2 below.

The fractional interpolative frequency divider (FIFD) 160 is used to divide down a frequency of the reference clock signal 114 to a desired frequency. Division of the reference clock frequency can be performed with a floating point number, i.e., a number which contains a fractional part. Some examples of floating point numbers are but are not limited to 10.24585, 25.67895456, etc. Those of skill in the art will understand that floating point numbers can have different degrees of precision (expressed by the number of places to the right of the decimal point). Accommodation of division by all such floating point numbers which have practical significance to systems of interest are accomplished through various embodiments of the invention and no limitation is implied by the examples provided herein.

The output 162 from the FIFD 160 is input to the oscillator control circuit 170. In one or more embodiments, the oscillator control circuit 170 includes a delay 172, a delay 174, and a DFF 178. It is a system design goal to create a realignment signal with a width that is approximately equal to or less than a width of a low state in the ring VCO output signal 156. Therefore in one embodiment, in operation, the output from the FIFD 160 is delayed by one-half of a ring VCO clock cycle at delay 172 and is referred to herein as "a delayed output of the FIFD 176." The output of the delay 172 is delayed by a second one-half of the ring VCO clock cycle at delay 174 and is referred to as "a further delayed output of the FIFD 118" or synonymously as the feedback clock signal 118. The first delayed output of the FIFD 176 is input to the DFF 178 as the DFF 178's clock signal. Power is provided to the DFF 178 at 110. In operation, when the delayed output of the FIFD 176 goes high, the realign signal 180 goes high and stops ring VCO 104 at the last device in the ring 154. Note that the ring VCO 104 is stopped when the output of ring VCO 104 is in a low state (typically represented by output value zero) in order to minimize spurious signals that contribute to oscillator phase noise. The reference clock signal 114 resets DFF 178 which brings the realignment signal 180 low. When the realignment signal 180 goes low, the output 156 of NOR is gate 154 enabled, thereby restarting the ring VCO 104. Note that it is the state transition of the reference clock signal 114 that forms the state transition in the realignment signal 180 which restarts the ring VCO 104. Therefore, the ring VCO 104 is realigned to the reference clock signal 114. This realignment removes phase noise accumulated since the last reset of the ring VCO 104.

In other embodiments of the invention, realignment can be performed less frequently than at the frequency of the reference clock signal 114 by skipping reference clock cycles. For example, less frequent realignment can be achieved by skipping reference cock signals thereby permitting realignment at lower frequencies, such as for example ½ the reference clock frequency, ¼ the reference clock frequency, etc.

Figure 2:
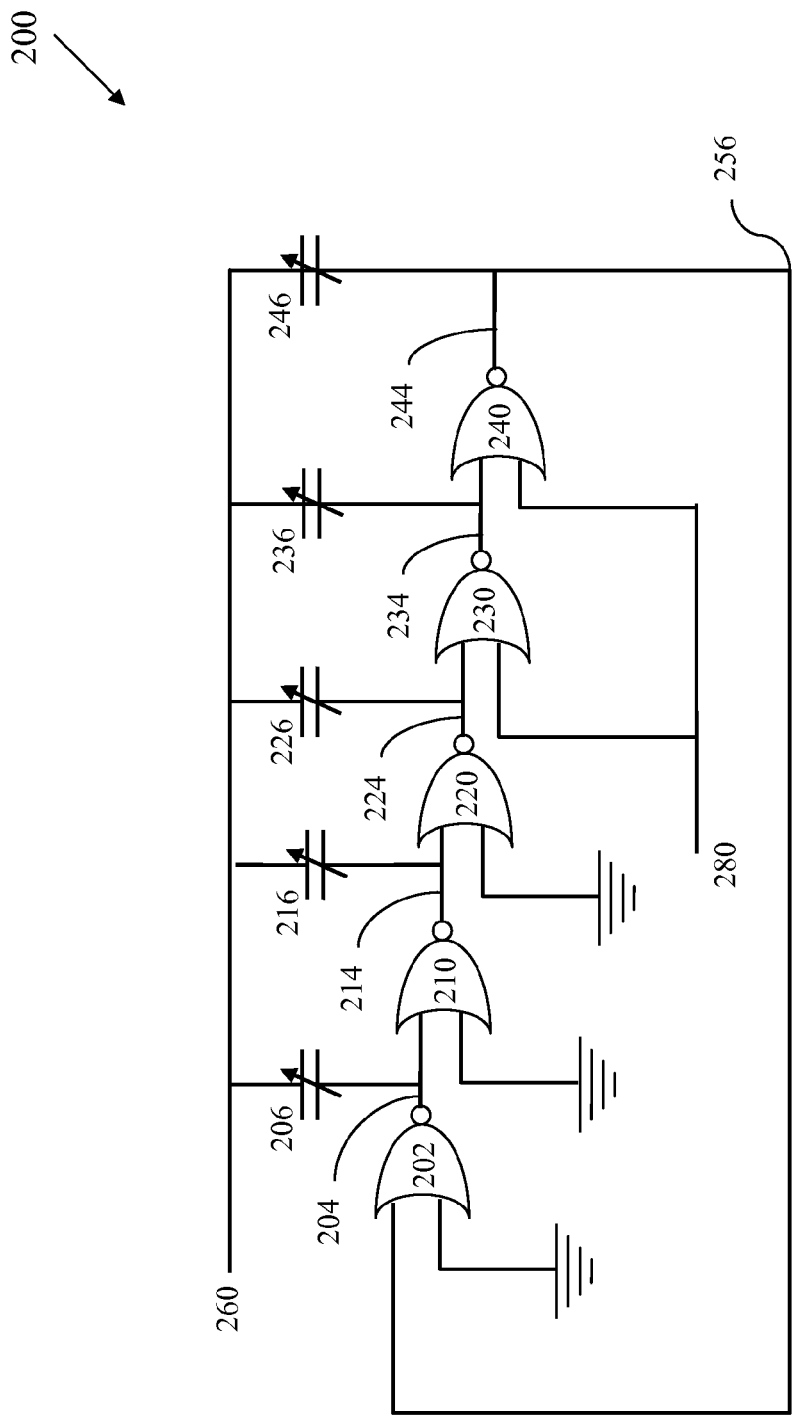
FIG. 2 illustrates a ring voltage controlled oscillator (VCO), according to embodiments of the invention.

FIG. 2 illustrates, generally at 200, a ring voltage controlled oscillator (VCO), according to embodiments of the invention. With reference to FIG. 2, in one embodiment, a ring VCO is constructed with an odd number, in this example five, of NOR gates, 202, 210, 220, 230, and 240. Each NOR gate is connected to the next by making an output of an earlier NOR gate an input of a later NOR gate. In this example, an output 204 of NOR gate 202 is input to NOR gate 210. An output 214 of NOR gate 210 is an input to NOR gate 220. An output 224 of NOR gate 220 is input to NOR gate 230. An output 234 of NOR gate 230 is input to NOR gate 240. The last device in the ring 240 provides an output 244 of the ring VCO 256. The output 244 is fed back and input to the first device 202 thus completing the ring 256.

A control voltage signal is applied at 260 and is generated from a signal comparison circuit such as described above in conjunction with FIG. 1. Varying the control voltage 260 enables tuning of an oscillation frequency of the ring VCO 256. Alternatively, tuning can be accomplished with varactors 206, 216, 226, 236, and 246. Oscillation of the ring VCO 256 can be stopped when the signal 280 applied to devices 230 and 240 goes high. Oscillation can be started again when the signal 280 applied to devices 230 and 240 goes low. In FIG. 2, two NOR gates are used to stop oscillation of the ring VCO 256. In some designs it is useful to use multiple devices to stop and start oscillation in order to remove spurious signals and obtain a lower oscillator phase noise level.

Alternative arrangements of devices can be used in a ring VCO for use with embodiments of the invention. As described above in conjunction with FIG. 1, a ring VCO is made with a combination of inverters and NOR gates. Other devices can be substituted for the inverters and NOR gates described above and embodiments of the invention are not limited to these two device types. Any ring VCO that is configured to be stopped and started can be used with various embodiments of the invention.

Figure 3:
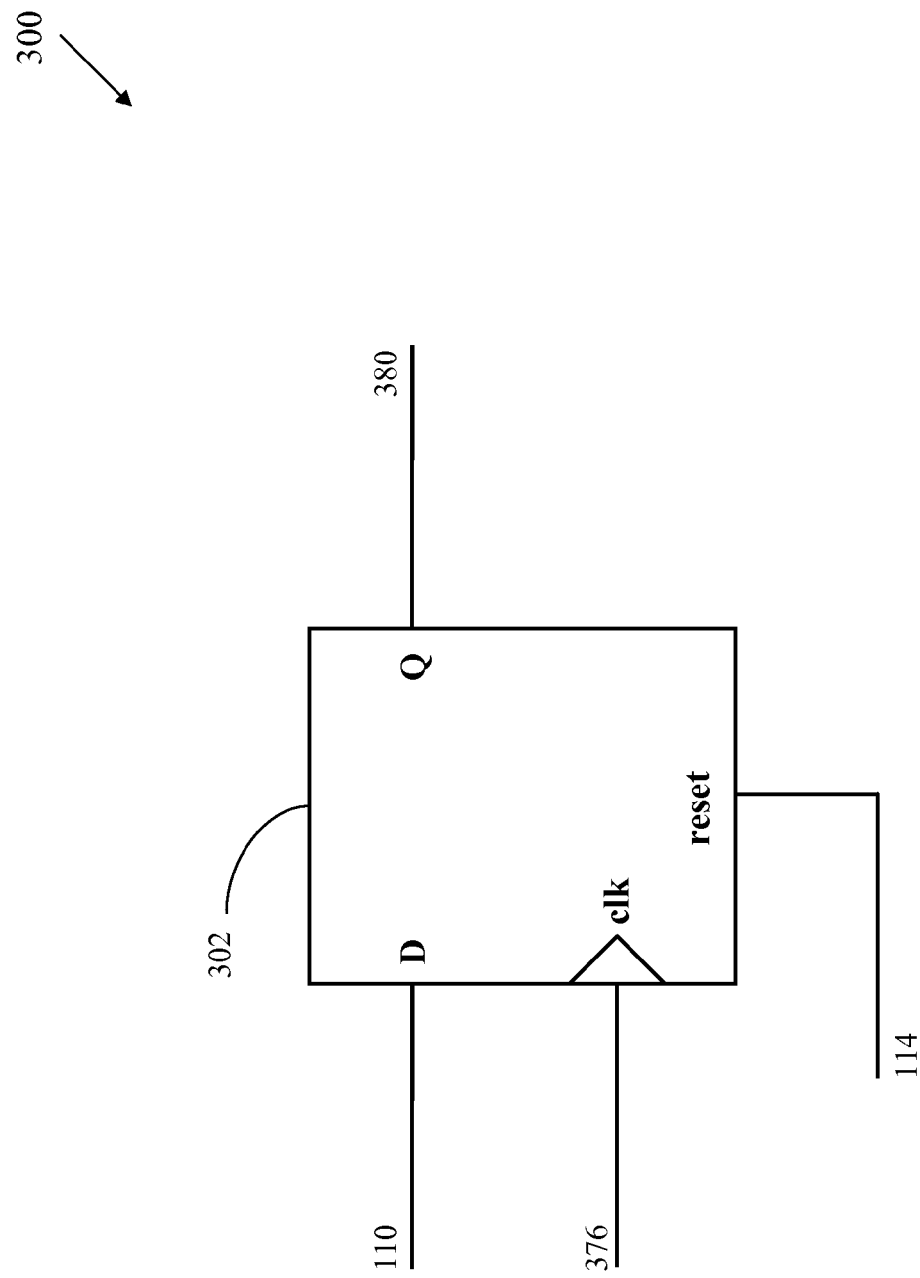
FIG. 3 illustrates an oscillator control circuit, according to embodiments of the invention.

FIG. 3 illustrates, generally at 300, an oscillator control circuit, according to embodiments of the invention. With reference to FIG. 3, an oscillator control circuit is obtained by configuring a D flip flop (DFF). As described above in conjunction with FIG. 3, a DFF 302 is coupled to a source of power at 110. A first delayed output of the FIFD 376 is connected to the DFF 302's clock input. A reference clock 114 is coupled to the reset port of the DFF 302. The output port of the DFF 302 provides a realignment signal 380. Realignment signal 380 is used to stop and restart ring VCOs as described in the figures above.

In other embodiments, oscillator control circuits are constructed with components in place of or in addition to the DFF 302 shown in FIG. 3. Those of skill in the art will recognize that control logic can be implemented with other components to provide the necessary alignment signal to a ring VCO. Embodiments of the invention are not limited to the DFF of FIG. 3.

FIG. 4A illustrates, generally at 400, times series representations of signals used to create the alignment signal, according to embodiments of the invention. With reference to FIG. 4A, the reference clock signal from FIG. 1 is shown 114. The first delayed output of the FIFD 176 (from FIG. 1) is shown at 176 in FIG. 4A. The first delayed output of the FIFD 176 (from FIG. 1) is delayed by one-half of the ring VCO cycle as indicated at 402a and 402b. The alignment signal 180 (From FIG. 1) is shown at 180 having a first alignment peak 420 and a second alignment peak 422. The ring VCO output 156 (from FIG. 1) is shown at 156 in FIG. 4A. A width of the alignment peak 420 or 422 is designed to be less than or equal to one-half 412 of the ring VCO clock cycle 414. Accordingly, the alignment signal triggers stop and start of the ring VCO output while the ring VCO is in a low state as indicated at 412.

An edge 426 of alignment peak 420 causes the ring VCO output 156 to stop and an edge 428 of the alignment peak 420 causes the ring VCO output 156 to restart oscillation which accomplishes a realignment of the ring VCO output 156 with the reference clock signal 114. Similarly, an edge 430 of alignment peak 422 causes the ring VCO output 156 to stop and an edge 432 of the alignment peak 422 causes the ring VCO output 156 to restart oscillation which accomplishes a realignment of the ring VCO output 156 with the reference clock signal 114. Phase noise can only accumulate over the oscillation duration indicated at 424, which is the number of ring VCO cycles in between alignment peaks as shown in this example.

Figure 4B:
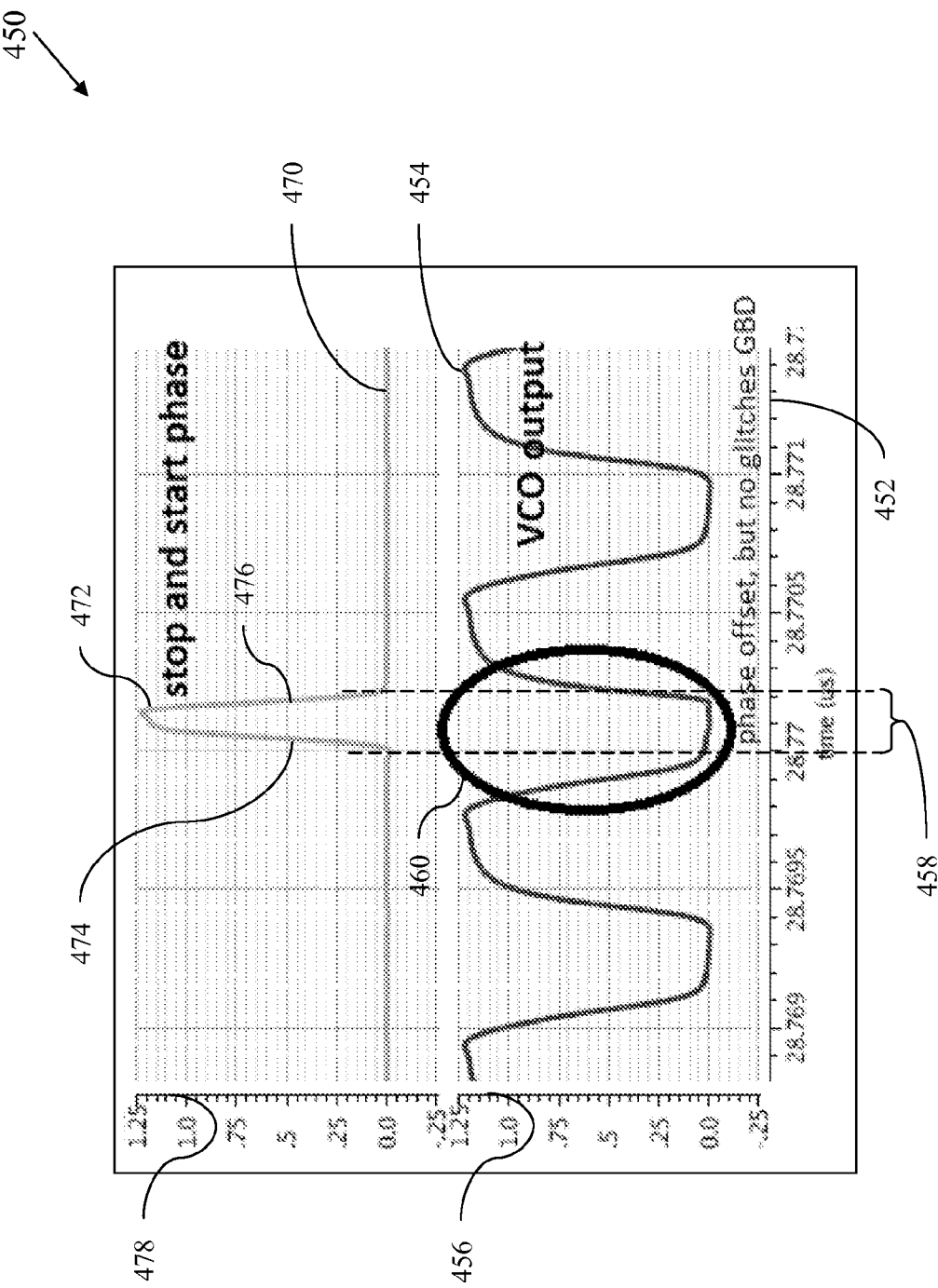
FIG. 4B illustrates times series representations of signals used to create the alignment signal in a simulation, according to embodiments of the invention.

FIG. 4B illustrates, generally at 450, times series representations of signals used to create the alignment signal in a simulation, according to embodiments of the invention. With reference to FIG. 4B a computer simulation is presented for an implementation of a fractional reference injected phase locked loop (FRIPLL). Time is indicated on the horizontal axis at 452. Amplitude is indicated for two signals along the vertical axis at 456 and 478. The realignment signal is plotted at 470. The realignment signal 470 has a realignment amplitude peak indicated at 472 with a rising edge 474 corresponding to stopping the ring VCO and a falling edge 476 corresponding to restarting oscillation of the ring VCO. A ring VCO output signal is shown at 454 with a low state indicated at 458. As described above in conjunction with the preceding figures, the realignment signal is designed to occur during a low state of the ring VCO signal 458, thereby minimizing spurious signals in a region 460 in order to minimize phase noise.

Figure 5:
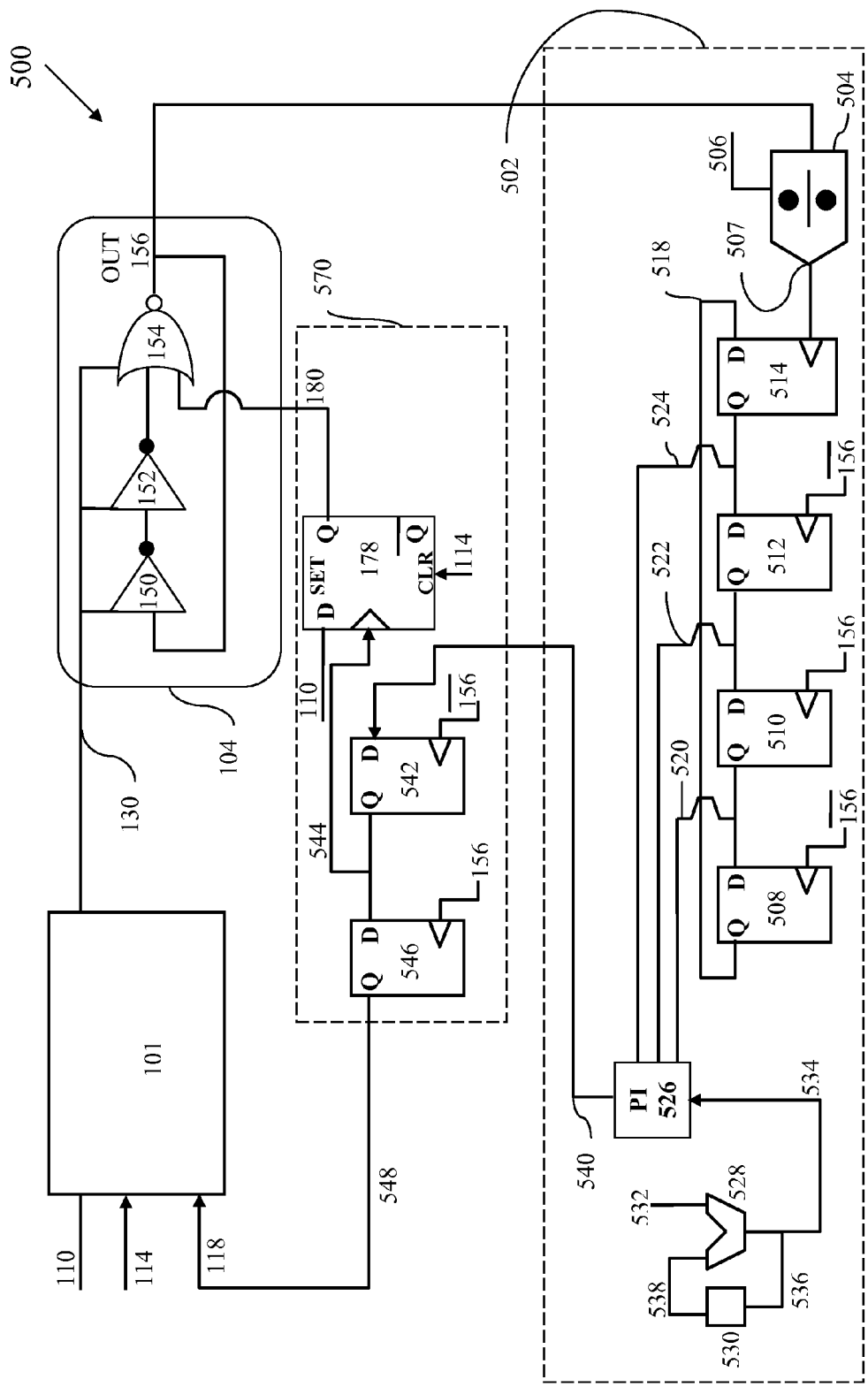
FIG. 5 illustrates an implementation of the fractional interpolative frequency divider (FIFD) configured for use with ring oscillator phase noise reduction, according to embodiments of the invention.

FIG. 5 illustrates, generally at 500, an implementation of the fractional interpolative frequency divider (FIFD) configured for use with ring oscillator phase noise reduction, according to embodiments of the invention. With reference to FIG. 5, a FIFD 502 is presented in the context of the FRIPLL from FIG. 1. The output 156 from the ring VCO 104 is input to an integer divider 504 of the FIFD 502. A desired frequency out of the ring VCO 104 is a design parameter of the system. For example, in one non-limiting embodiment, a reference oscillator frequency is 25 MHz. A desired ring VCO frequency is 1.246833 GHz. Dividing the desired VCO frequency by the reference oscillator frequency yields: $N_{FP}=49.873332$, which is the floating point number that the ring VCO frequency needs to be divided by. The FIFD 502 performs this division in two parts; first an integer divide is performed and then the fractional part is accounted for. In one embodiment of the example above, the integer divider 504 receives an input at 506 which is the integer component ($N_{INT}$) of $N_{FP}$. In this example, the integer value is 49. The fraction is obtained by subtracting 49 from 49.873332 to yield 0.873332. The fraction 0.873332 is input at 532. In some embodiments, an additional divide-by-two is implemented with latches 508, 510, 512, and 514 forming a loop. In the example of an additional divide by two $N_{INT}$ becomes 24 and the fraction becomes 0.936666.

The FIFD 502 is configured to process the input from the gated ring VCO 104 in the following way. An output 507 of the integer divider 504 is input to a clock input of the first latch 514. An inversion of the output of the ring VCO 156 is input to a clock input of the second latch 512.

An output 524 of the first latch 514 is coupled to an input of the second latch 512. The output of the ring VCO 156 is coupled to a clock input of a third latch 510. An output 522 of the second latch 512 is coupled to an input of the third latch 510. The inversion of the output of the ring VCO 156 is coupled to a clock input of a fourth latch 508. An output 520 of the third latch 510 is coupled to an input of the fourth latch 508. An output of the fourth latch 508 is coupled to an input of the first latch 514, which completes a loop 518.

A phase interpolator 526 receives as inputs, the output 524 from the first latch 514, the output 522 from the second latch 512, the output 520 from third latch 510, and the output 534 from an accumulator 528. A fraction 532 is input to the accumulator 528 and a loop consisting of a path 536, a delay 530, and a path 538 provide a sigma delta modulator circuit that processes the fraction, which is passed at 534 to the phase interpolator 526 as a weight or error signal. The phase interpolator 526 produces a vector sum based on its inputs and the weight (error signal) in order to complete division of a reference frequency by the desired floating point number, thereby providing actual division of a frequency by a fractional number.

An oscillator control circuit 570 receives an output 540 of the phase interpolator 526. The output 540 of the phase interpolator 526 is input to a first delay unit 542. The first delay unit 542 receives the inversion of the output of the ring VCO 156 as a clock input. An output 544 of the first delay unit 542 is the first delayed output of the FIFD which is provided as a clock input to the DFF 178. A second delay unit 546 receives the output 544 of the first delay unit 542 as an input. The second delay unit 546 receives the output of the ring VCO 156 as a clock input. An output 548 of the second delay 546 unit is the further delayed output of the FIFD which is input to the signal comparison circuit 101 as the feedback signal 118. 548 and 118 refer to the same signal and are used to illustrate the progression from FIG. 1 to FIG. 5.

Figure 6:
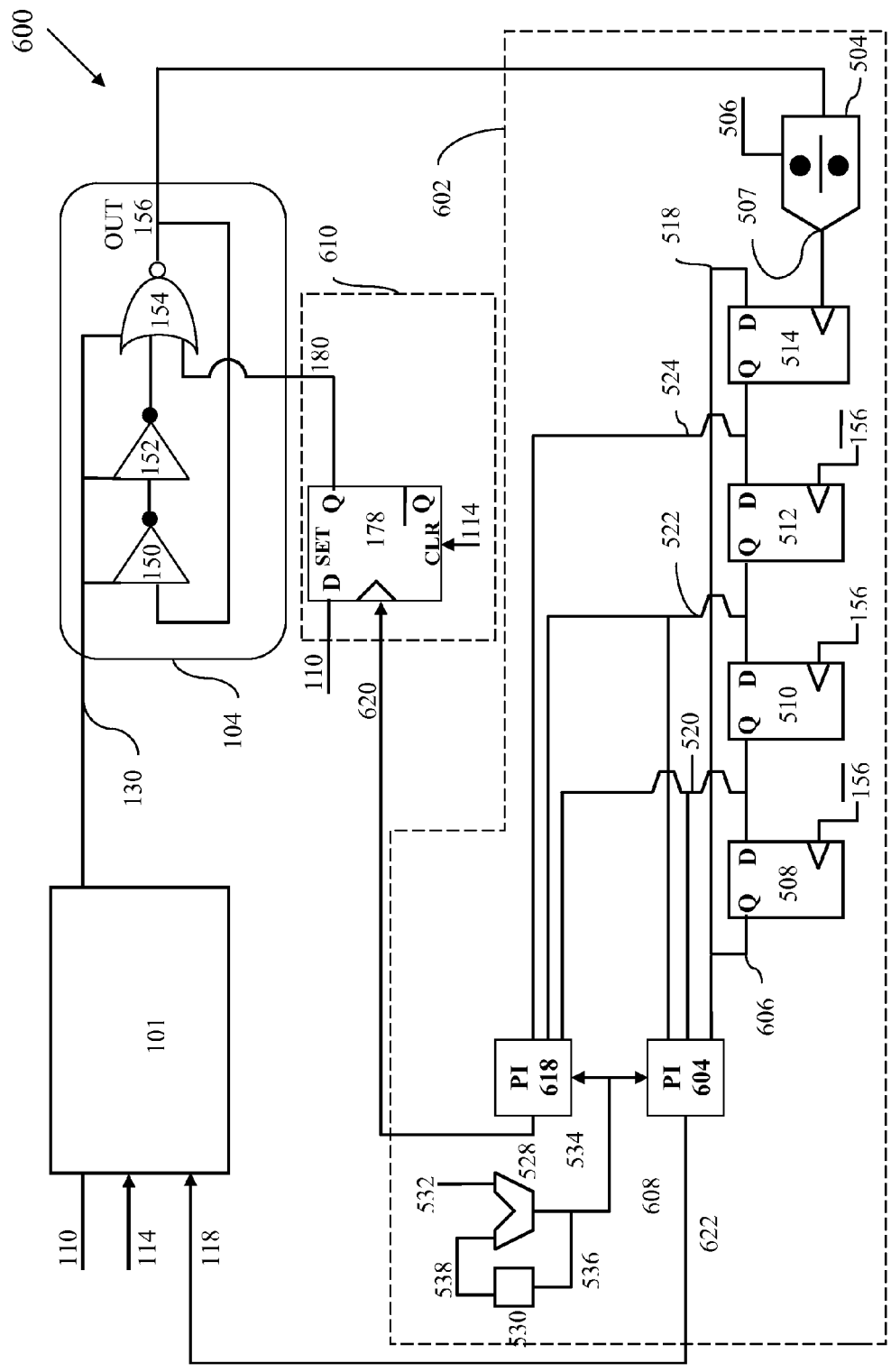
FIG. 6 illustrates another implementation of the fractional interpolative frequency divider (FIFD) equipped for ring oscillator phase noise reduction, according to embodiments of the invention.

FIG. 6 illustrates, generally at 600, another implementation of the fractional interpolative frequency divider (FIFD) equipped for ring oscillator phase noise reduction, according to embodiments of the invention. With reference to FIG. 6, an alternative implementation of a FIFD is shown at 602 and an oscillator control circuit is shown at 610. Two phase interpolators are used in FIFD 602. A first phase interpolator 604 receives as inputs an output 522 from the second latch 512, an output 520 from the third latch 510, an output 606 from the fourth latch 508, and an output 608 from the accumulator 528. Note that the latch inputs into the first phase interpolator 604 are different the latch inputs shown in FIG. 5 for the phase interpolator 526. An output 622 from the first phase interpolator 604 is the further delayed output of the FIFD 602 which is delayed by one full ring VCO output cycle and is also the feedback signal 118. 622 and 118 refer to the same signal and are used to illustrate the progression from FIG. 1 to FIG. 6.

A second phase interpolator 618 receives as inputs the output 524 from the first latch 514, the output 522 from the second latch 512, the output 520 from the third latch 510, and the output 534 from the accumulator 528. An output 620 from the second phase interpolator is the first delayed output of the FIFD 602 and is delayed by one-half of the ring VCO clock cycle. Note that in the design of the FIFD 602, the first delayed output of the FIFD 602 and the further delayed output of the FIFD 602 are extracted separately from fractionally dividing down the ring VCO output 156 in two different mixing operations occurring in separate phase interpolators 604 and 618. Hence, discrete delays such as 542 and 546 (FIG. 5) are not used in 600 to delay a single FIFD output in order to obtain the first delayed output of the FIFD and the further delayed output of the FIFD as was done in 500 in FIG. 5.

Figure 7:
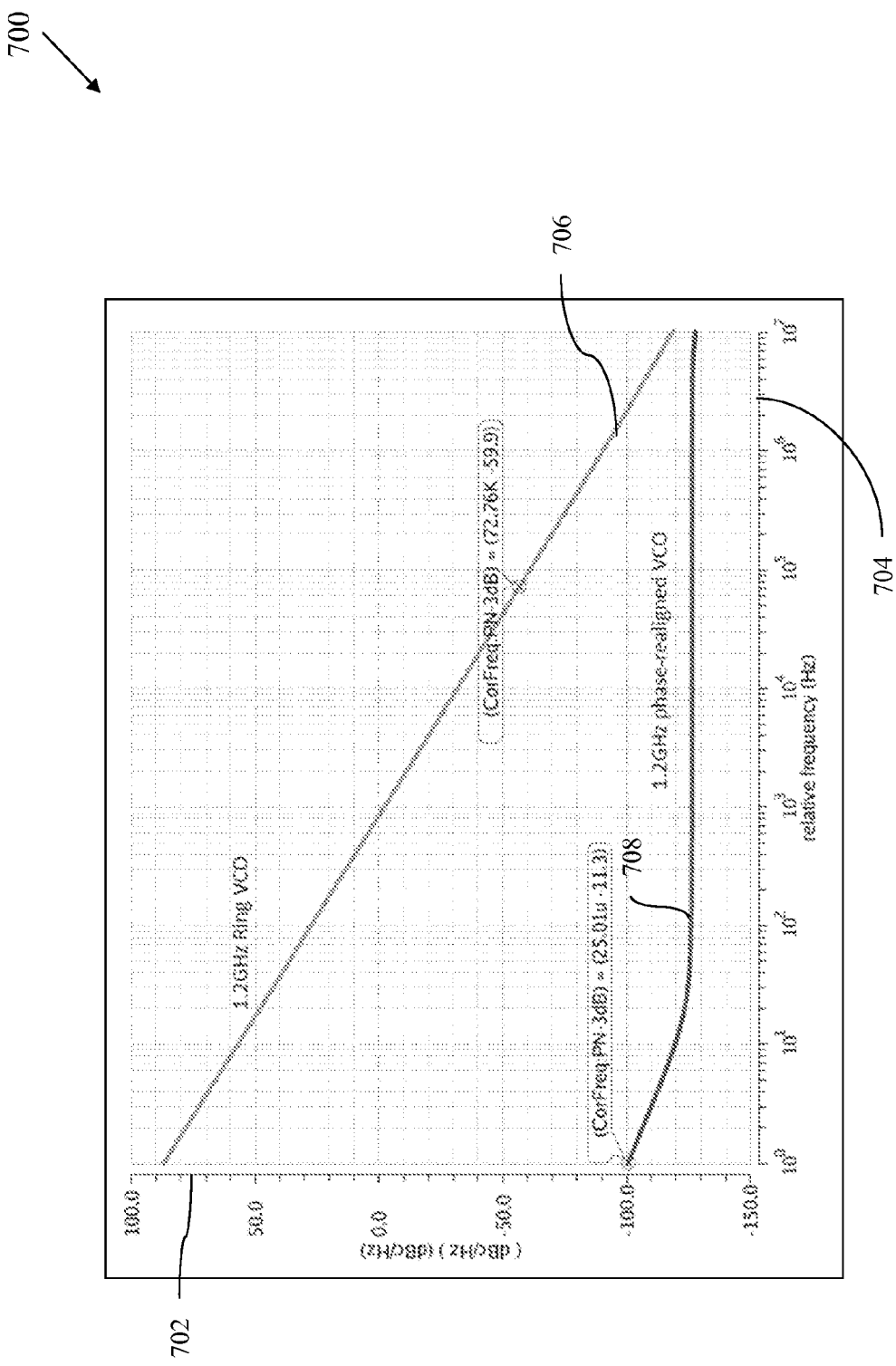
FIG. 7 illustrates a plot of phase noise reduction, according to embodiments of the invention.

FIG. 7 illustrates, generally at 700, a plot of phase noise reduction, according to embodiments of the invention. With reference to FIG. 7, a comparison of phase noise is presented for a specific application of a circuit containing an embodiment of an invention against the same circuit without the contribution from the embodiment of the invention. Amplitude is plotted on a vertical axis 702 with units of dBc/Hz (dBc is a power ratio of the measured value relative to the carrier signal). Relative frequency is plotted on a horizontal axis 704 with units of hertz (Hz) and is the offset frequency from the carrier frequency. The simulation used a frequency for a ring VCO which was centered on 1.2 GHz although other frequencies can be implemented. A plot 706 illustrates phase noise performance without the embodiment of the invention incorporated into the circuit. In this case the ring VCO was not being realigned to the reference clock signal. A plot 708 measures phase noise with the embodiment of the invention periodically realigning an output of the ring VCO to the reference clock signal. Phase noise accumulates as described above; hence the amplitude of 706 is greater than the amplitude of 708 for all offset frequency.

FIG. 8 illustrates, generally at 800, a table of values that correspond with the plot shown in FIG. 7, according to embodiments of the invention. With reference to FIG. 8, a column 802 lists offset frequency (X axis 704 from FIG. 7). A column 804 lists corresponding amplitude points from 706. A column 806 lists corresponding amplitude values from 708. A column 820 lists the change in phase noise relative to the level of 706 (without realignment), hence phase noise has been reduced from 153.71 dBc/Hz (at 100 Hz offset frequency) to 9.53 dBc/Hz (at 10 MHz) offset frequency with realignment.

Figure 9:
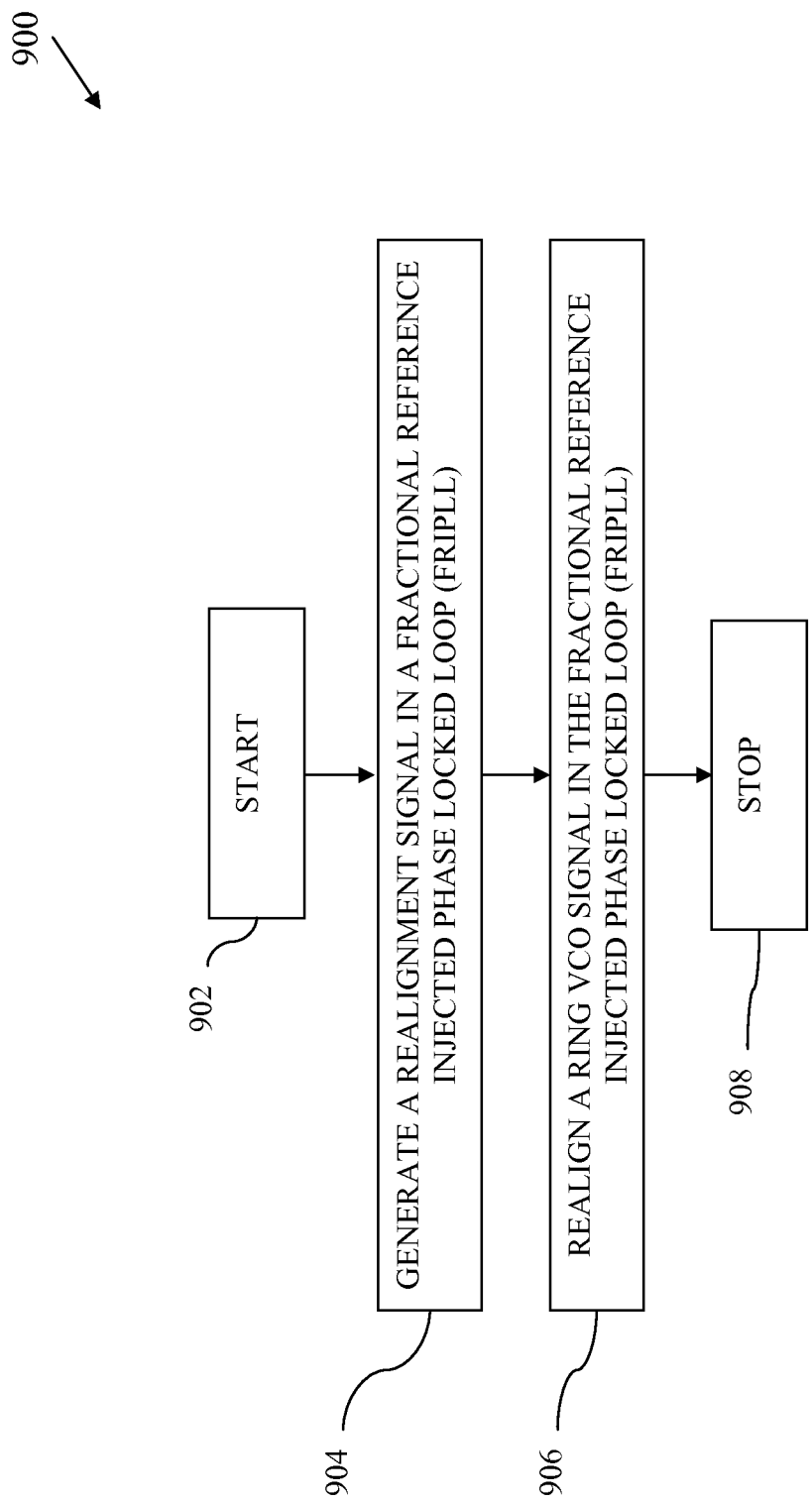
FIG. 9 illustrates a process for phase noise reduction, according to embodiments of the invention.

FIG. 9 illustrates, generally at 900, a process for phase noise reduction, according to embodiments of the invention. With reference to FIG. 9, a process starts at a block 902. At a block 904 a realignment signal is generated in a fractional reference injected phase locked loop. Generating realignment signals has been described above in conjunction with for example FIG. 1, FIG. 5, and FIG. 6. Examples of realignment signals are illustrated in FIG. 4A and FIG. 4B. At a block 906 a ring VCO signal is realigned to a reference clock signal in the fractional reference injected phase locked loop, thereby reducing ring VCO phase noise. Examples of a realigned ring VCO signal are illustrated in FIG. 4A and FIG. 4B. A reduction in oscillator phase noise is quantified in FIG. 7 and FIG. 8 for a specific embodiment of the invention. The process stops at a block 908.

In various embodiments, integrated circuits and methods (processes) have been described to reduce phase noise from a ring VCO output. Such embodiments are used to reduce phase noise from ring VCO output signals (clock signals) used in electronic devices such as computers, mobile phones, network equipment, communication channels that implement communication protocols such as Bluetooth (IEEE 802.15), Ethernet (IEEE 802.3 standard), Universal Serial bus (USB,) High Definition Multimedia Interface (HDMI,) IEEE 1394 standard (known as the Apple, Inc. product Firewire®,) etc. These examples are provided merely for illustration and are not meant to limit application of embodiments of the present invention. Embodiments, of the present invention are readily employed wherever a low power, low phase noise oscillator is required.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

Any of the methods according to the present invention can be implemented in hard-wired circuitry (e.g., integrated circuit(s)), by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods herein may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Non-transitory machine-readable media is understood to include any mechanism for storing information in a form readable by a machine (e.g., a computer). For example, a machine-readable medium, synonymously referred to as a computer-readable medium, includes read only memory (ROM); random access memory (RAM); magnetic disk storage media; optical storage media; flash memory devices; except electrical, optical, acoustical or other forms of transmitting information via propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

While the invention has been described in terms of several embodiments, those of skill in the art will recognize that the invention is not limited to the embodiments described, but can be practiced with modification and alteration within the spirit and scope of the appended claims. The description is thus to be regarded as illustrative instead of limiting.

What is claimed is:

1. A low noise fractional reference-injection phase locked loop (FRIPLL), comprising:
    a ring voltage controlled oscillator (VCO);
    a fractional interpolative frequency divider (FIFD), an output of the ring VCO is input to the FIFD;
    a signal comparison circuit receives a reference clock signal and a further delayed output of the FIFD, the signal comparison circuit produces a control voltage signal in response to a phase difference between the reference clock signal and the further delayed output of the FIFD, the control voltage signal is input to the ring VCO to control a ring VCO frequency; and an oscillator control circuit has a first input and a second input, the first input is a first delayed output of the FIFD and the second input is the reference clock signal, the oscillator control circuit generates a realignment signal which is used to realign a state transition in the ring VCO output signal to the reference clock signal when the ring VCO output signal is in a low state, realignment occurs repeatedly at a frequency of the reference clock signal, wherein oscillator phase noise is reduced because of the realignment of the state transition.

2. The low noise FRIPLL of claim 1, wherein delays are chosen for the first delayed output of the FIFD and the further delayed output of the FIFD to create a width for the realignment signal peak that is less than or equal to one-half of a ring VCO cycle.

3. The low noise FRIPLL of claim 2, wherein the first delayed output of the FIFD is delayed approximately one-half of the ring VCO cycle and the further delayed output of the FIFD is delayed another one-half of the ring VCO cycle relative to the first delayed output of the FIFD.

4. The low noise FRIPLL of claim 2, wherein a D flip flop is used in the oscillator control circuit, the reference clock signal is coupled to a reset port of the D flip flop, the first delayed output of the FIFD is coupled to a clock port of the D flip flop, and an output port of the D flip flop is coupled to an input of a device in the ring VCO, the device is configured as a NOR gate.

5. The low noise FRIPLL of claim 4, wherein the device is a last device in the ring VCO and the last device is configured as a NOR gate.

6. The low noise FRIPLL of claim 2, wherein a NOR gate is used for a last device in the ring VCO.

7. The low noise FRIPLL of claim 3, the FIFD further comprising:
an integer divider, an input of the integer divider is coupled to an output of the ring VCO;
a first latch, an output of the integer divider is coupled to a clock input of the first latch;
a second latch, an inversion of the output of the ring VCO is coupled to a clock input of the second latch, an output of the first latch is coupled to an input of the second latch;
a third latch, the output of the ring VCO is coupled to a clock input of the third latch, an output of the second latch is coupled to an input of the third latch;
a fourth latch, the inversion of the output of the ring VCO is coupled to a clock input of the fourth latch, an output of the third latch is coupled to an input of the fourth latch an output of the fourth latch is coupled to an input of the first latch; and
a phase interpolator, the phase interpolator receives the outputs from the first, second, and third latches as inputs and the phase interpolator receives an input from an accumulator, a fraction is input to the accumulator and the phase interpolator produces a vector sum based on its inputs in order to complete division of the ring VCO frequency by a desired floating point number.

8. The low noise FRIPLL of claim 7, wherein the oscillator control circuit further comprises:
a first delay unit, an output of the phase interpolator is input into the first delay unit and the first delay unit receives the inversion of the output of the ring VCO as a clock input, an output of the first delay unit is the first delayed output of the FIFD which is the first input to the oscillator control circuit; and
a second delay unit, the second delay unit receives the output of the first delay unit as an input and the second delay unit receives the output of the ring VCO as a clock input, an output of the second delay unit is the further delayed output of the FIFD which is input to the signal comparison circuit.

9. The low noise FRIPLL of claim 3, wherein the first delayed output of the FIFD and the further delayed output of the FIFD are extracted from the FIFD without using dedicated latches to provide a delay equal to one-half of the ring VCO cycle for the first delayed output of the FIFD and a delay equal to one-half of the ring VCO cycle for the further delayed output of the FIFD relative to the first delayed output of the FIFD.

10. The low noise FRIPLL of claim 9, the FIFD further comprising:
an integer divider, an input of the integer divider is coupled to an output of the ring VCO;
a first latch, an output of the integer divider is coupled to a clock input of the first latch;
a second latch, an inversion of the output of the ring VCO is coupled to a clock input of the second latch, an output of the first latch is coupled to an input of the second latch;
a third latch, the output of the ring VCO is coupled to a clock input of the third latch, an output of the second latch is coupled to an input of the third latch;
a fourth latch, the inversion of the output of the ring VCO is coupled to a clock input of the fourth latch, an output of the third latch is coupled to an input of the fourth latch, an output of the fourth latch is coupled to an input of the first latch;
a first phase interpolator, the first phase interpolator receives the outputs from the second, third, and fourth latches as inputs and the first phase interpolator receives an input from an accumulator, an output of the first phase interpolator is the further delayed output of the FIFD which is input to the signal comparison circuit; and
a second phase interpolator, the second phase interpolator receives the outputs from the first, second, and third latches as inputs and the second phase interpolator receives an input from the accumulator, a fraction is input to the accumulator and the first phase interpolator and the second phase interpolator produce a vector sum based on their inputs in order to complete division of the ring VCO frequency by a desired floating point number, an output of the second phase interpolator is the first delayed output of the FIFD which is input to the oscillator control circuit.

11. The low noise FRIPLL of claim 1, wherein the signal comparison circuit utilizes a signal comparator.

12. The low noise FRIPLL of claim 11, wherein the signal comparator is selected from the group consisting of a phase detector, phase-frequency detector, and a time to digital converter.

13. The low noise FRIPLL of claim 1, wherein the ring VCO is a gated ring voltage controlled oscillator.

14. A method to reduce noise in a fractional reference-injection phase locked loop (FRIPLL), comprising:
generating a realignment signal for a ring voltage controlled oscillator (VCO) wherein the generating uses an oscillator control circuit, a reference clock signal, and a first delayed output from a fractional interpolative frequency divider (FIFD), wherein an output of the ring VCO is an input to the FIFD; and realigning a state transition in the ring VCO output signal to the reference clock signal wherein the realigning occurs when the ring VCO output signal is in a low state, the realignment signal causes the ring VCO to stop and then restart oscillation, the realigning is performed at a frequency of the reference clock signal, wherein oscillator phase noise is reduced because of the realigning.

15. The method of claim 14, wherein the generating uses the ring VCO output signal and an inversion of the ring VCO output signal to create a width for the realignment signal peak that is approximately equal to one-half of the ring VCO cycle.

16. The method of claim 14, wherein the generating uses the ring VCO output signal and an inversion of the ring VCO output signal to create a width for the realignment peak that is less than one-half of the ring VCO cycle.

17. The method of claim 15, wherein the generating uses the first delayed output of the FIFD which is delayed approximately one-half of the ring VCO cycle and a further delayed output of the FIFD which is delayed another one-half of the ring VCO cycle relative to the first delayed output of the FIFD.

18. The method of claim 16, wherein during the realigning, a reference clock state transition causes the ring VCO to restart oscillation, thereby reducing oscillator phase noise.

19. The method of claim 15, wherein the realigning breaks the ring VCO at a last device in a ring, the last device in the ring is configured as a NOR gate, and the ring VCO is a gated ring VCO.

20. A low noise fractional reference-injection phase locked loop (FRIPLL), comprising:

a ring voltage controlled oscillator (VCO);

an fractional interpolative frequency divider (FIFD), an output of the ring VCO is an input to the FIFD;

means for generating a realignment signal for the ring VCO using as inputs a reference clock signal, and a first delayed output from the FIFD;

means for realigning a state transition in the ring VCO output signal to a reference clock signal wherein the realigning occurs when the ring VCO output signal is in a low state, the realignment signal causes the ring VCO to restart oscillation; and means for performing the realigning at a frequency of the reference clock signal, wherein oscillator phase noise is reduced because of the realigning.

21. The low noise FRIPLL of claim 20, wherein the means for generating the realignment signal uses the ring VCO output signal and an inversion of the ring VCO output signal to create a width for the realignment signal peak that is less than one-half of the ring VCO cycle.

22. The low noise FRIPLL of claim 21, wherein the means for realigning breaks the ring VCO at a last device in a ring, the last device in the ring is configured as a NOR gate, and the ring VCO is a gated ring VCO.

23. The low noise FRIPLL of claim 21, wherein the means for generating the realignment signal forms the first delayed output from the FIFD and the further delayed output from the FIFD.

24. The low noise FRIPLL of claim 1, wherein realignment occurs at a frequency which is less than the frequency of the reference clock signal.

25. The method of claim 14, wherein the realigning is performed at a frequency which is less than the frequency of the reference clock signal.

26. The low noise FRIPLL of claim 20, wherein the means for performing the realigning operates at a frequency which is less than the frequency of the reference clock signal.

* * * * *